(12) United States Patent
Yim et al.

(10) Patent No.: US 9,768,413 B2
(45) Date of Patent: Sep. 19, 2017

(54) ORGANIC LIGHT EMITTING DIODE DISPLAY

(71) Applicant: Samsung Display Co., Ltd., Yongin-si, Gyeonggi-do (KR)

(72) Inventors: Sang Hoon Yim, Suwon-si (KR); Dong Chan Kim, Gunpo-si (KR); Won Jong Kim, Suwon-si (KR); Eung Do Kim, Seoul (KR); Jae Bok Kim, Hwaseong-si (KR); Dong Kyu Seo, Hwaseong-si (KR); Won Jun Song, Hwaseong-si (KR); Ji Hye Lee, Incheon (KR); Da Hea Im, Incheon (KR); Yoon Hyeung Cho, Yongin-si (KR); Won Suk Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/991,836

(22) Filed: Jan. 8, 2016

(65) Prior Publication Data
US 2016/0380231 A1     Dec. 29, 2016

(30) Foreign Application Priority Data

Jun. 25, 2015  (KR) .......... 10-2015-0090723

(51) Int. Cl.
*H01L 51/00* (2006.01)
*H01L 51/52* (2006.01)
*H01L 27/32* (2006.01)

(52) U.S. Cl.
CPC ...... *H01L 51/5253* (2013.01); *H01L 51/5234* (2013.01); *H01L 27/3244* (2013.01);
(Continued)

(58) Field of Classification Search
CPC ............ H01L 27/3248; H01L 51/5253; H01L 51/5218; H01L 51/5234
See application file for complete search history.

(56) References Cited

U.S. PATENT DOCUMENTS

2006/0113907 A1* 6/2006 Im ................. H01L 51/5253
                                                           313/512
2006/0220542 A1* 10/2006 Suh ................ G02F 1/136286
                                                           313/506
(Continued)

FOREIGN PATENT DOCUMENTS

KR  10-2007-0103463 A   10/2007
KR  10-2014-0029057 A   3/2014
KR  10-2014-0069711 A   6/2014

OTHER PUBLICATIONS

Park et al., "Omnidirectional color filters capitalizing on a nano-resonator of Ag—$TiO_2$-Ag integrated with a phase compensating dielectric overlay," Scientific Reports, 5: 8467, Feb. 16, 2015.

*Primary Examiner* — Nicolas Tobergte
(74) *Attorney, Agent, or Firm* — Lewis Roca Rothgerber Christie LLP

(57) ABSTRACT

An organic light emitting diode (OLED) display according to the present disclosure includes a substrate, a thin film transistor on the substrate, a first electrode on the thin film transistor and electrically coupled to the thin film transistor, an organic emission layer on the first electrode, a second electrode on the organic emission layer, and a capping layer on the second electrode, wherein a thickness of the second electrode is about 65 Å to about 125 Å, and wherein a thickness of the capping layer is about (500*1.88/n) Å to about (700*1.88/n) Å, n being an optical constant of the capping layer.

19 Claims, 9 Drawing Sheets

(52) U.S. Cl.
CPC .... *H01L 51/5281* (2013.01); *H01L 2251/301* (2013.01); *H01L 2251/558* (2013.01)

(56) References Cited

U.S. PATENT DOCUMENTS

| | | | | |
|---|---|---|---|---|
| 2008/0157663 A1* | 7/2008 | Sung | ................... | H01L 51/5234 313/504 |
| 2008/0197768 A1* | 8/2008 | Conway | ................. | C09K 11/06 313/504 |
| 2008/0315207 A1* | 12/2008 | Yang | ................. | H01L 21/02488 257/66 |
| 2014/0125219 A1* | 5/2014 | Choi | ...................... | H05B 33/28 313/503 |
| 2016/0036002 A1* | 2/2016 | Seo | .................... | H01L 51/5256 257/40 |
| 2016/0197126 A1* | 7/2016 | Yoo | .................... | H01L 27/3283 257/40 |

* cited by examiner

ORGANIC LIGHT EMITTING DIODE DISPLAY

CROSS-REFERENCE TO RELATED APPLICATION

This application claims priority to, and the benefit of, Korean Patent Application No. 10-2015-0090723 filed in the Korean Intellectual Property Office on Jun. 25, 2015, the entire contents of which are incorporated herein by reference.

BACKGROUND

1. Field

The present disclosure relates to an organic light emitting diode (OLED) display.

2. Description of the Related Art

An organic light emitting diode (OLED) display includes a hole injection electrode, an electron injection electrode, and an organic light emitting element therebetween and including an organic emission layer. The OLED display is a self-emissive type of display device in which excitons, in which holes injected from the hole injection electrode and electrons injected from the electron injection electrode are combined in the organic emission layer, fall from an excited state to a ground state so as to emit light.

Because the OLED display does not require an additional light source as a self-emissive type of display device, the OLED display is receiving attention as a next generation display device because of a low operating voltage, implementation of a lightweight and thin design, and high quality characteristics, such as a wide viewing angle, high contrast, and a fast response speed.

However, color shift, when viewed from a lateral viewing angle of the OLED display, may occur due to an emission angle that is set in an organic light emitting element.

The above information disclosed in this Background section is only to enhance the understanding of the background of the disclosure and therefore it may contain information that does not form the prior art that is already known in this country to a person of ordinary skill in the art.

SUMMARY

The present disclosure provides an organic light emitting diode (OLED) display that is capable of reducing color shift occurring at a side viewing angle.

An exemplary embodiment of the present disclosure provides an OLED display including a substrate, a thin film transistor on the substrate, a first electrode on the thin film transistor and electrically coupled to the thin film transistor, an organic emission layer on the first electrode, a second electrode on the organic emission layer, and a capping layer on the second electrode, wherein a thickness of the second electrode is about 65 Å to about 125 Å, and wherein a thickness of the capping layer is about (500*1.88/n) Å to about (700*1.88/n) Å, n being an optical constant of the capping layer.

n may correspond to a wavelength of about 530 nm.

n may be about 1.88 at a wavelength of about 530 nm.

The thickness of the capping layer may be about 500 Å to about 700 Å.

The thickness of the capping layer may be about 550 Å to about 650 Å.

n may be about 2.07 at a wavelength of about 530 nm.

The thickness of the capping layer may be about 454 Å to about 700 Å.

n may be about 2.36 at a wavelength of about 530 nm.

The thickness of the capping layer may be about 398 Å to about 557 Å.

The second electrode may include silver (Ag).

The second electrode may further include at least one of Yb, Mg, or Al.

The second electrode may include about 90 vol % or more of the silver (Ag).

The thickness of the second electrode may be about 95 Å to about 105 Å.

One of the first electrode and the second electrode may include a transflective layer.

The capping layer may include an organic layer or an inorganic layer.

The organic emission layer may include a hole injection layer and a hole transporting layer on the first electrode, an emission layer on the hole transporting layer, and an electron transporting layer and an electron injection layer on the emission layer.

The first electrode may include an anode, and the second electrode may include a cathode.

The OLED display may further include a thin film encapsulation layer that is on the capping layer, that is bonded and encapsulated with the substrate, and that encapsulates an organic light emitting element.

In addition to the aforementioned aspects of the present disclosure, other aspects of the present disclosure will be described below or will be clearly understood through a description and an explanation below by those skilled in the art.

According to the present embodiment, as described above, the blue shift can be reduced by adjusting the thicknesses of the second electrode and the capping layer of the OLED display, thereby improving the side viewing angle.

In addition, other aspects of the present disclosure may be newly recognized through exemplary embodiments of the present disclosure.

DETAILED DESCRIPTION

Figure 1:
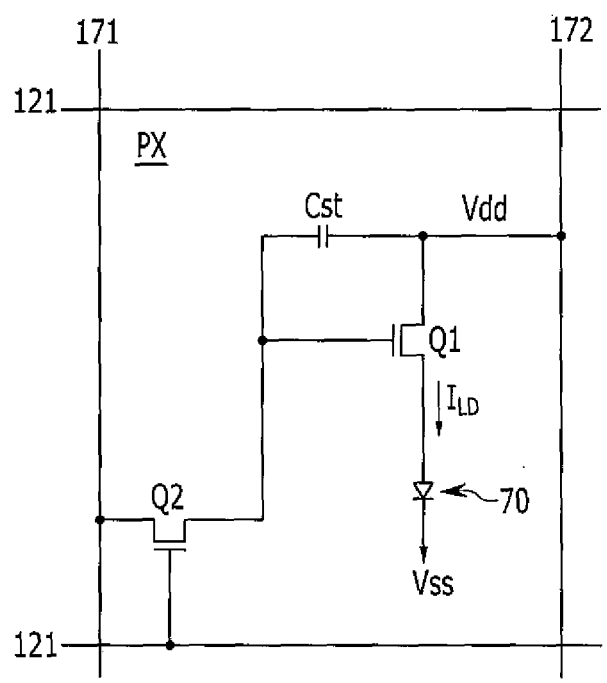
FIG. 1 is a circuit diagram of one pixel of an organic light emitting diode (OLED) display according to an exemplary embodiment of the present disclosure.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

First, referring to FIG. 1, one pixel of an organic light emitting diode (OLED) display according to an exemplary embodiment of the present disclosure will be described.

FIG. 1 is a circuit diagram of one pixel of an OLED display according to an exemplary embodiment of the present disclosure.

Referring to FIG. 1, the OLED display according to the current exemplary embodiment of the present disclosure includes a plurality of signal lines 121, 171, and 172, and a plurality of pixels PX that are respectively connected thereto and that are arranged in an approximate matrix form.

The signal lines 121, 171, and 172 include a plurality of first signal lines 121 for transmitting a gate signal (or a scanning signal), a plurality of second signal lines 171 for transmitting a data signal, and a plurality of third signal lines 172 for transmitting a driving voltage Vdd. The first signal lines 121 substantially extend in a row/horizontal direction and are nearly parallel to each other, and the second signal lines 171 and the third signal lines 172 extend in a column/vertical direction and are nearly parallel to each other while crossing the first signal lines 121.

Each pixel PX includes a switching thin film transistor Q2, a driving thin film transistor Q1, a storage capacitor Cst, and an organic light emitting diode (OLED) 70.

The switching thin film transistor Q2 includes a control terminal, an input terminal, and an output terminal, the control terminal being connected to the first signal line 121, the input terminal being connected to the second signal line 171, and the output terminal being connected to the driving thin film transistor Q1. In response to the gate/scanning signal applied to the first signal line 121, the switching thin film transistor Q2 transmits the data signal applied to the second signal line 171 to the driving thin film transistor Q1.

The driving thin film transistor Q1 also has a control terminal, an input terminal, and an output terminal, the control terminal being connected to the switching thin film transistor Q2, the input terminal being connected to the third signal line 172, and the output terminal being connected to the OLED 70. The driving thin film transistor Q1 allows an output current ILD, which varies according to a voltage that is applied between the control terminal and the output terminal of the driving thin film transistor 172.

The capacitor Cst is connected between the control terminal and the input terminal of the driving thin film transistor Q1. This capacitor Cst is charged with the data signal applied to the control terminal of the driving thin film transistor Q1, and maintains the data signal even after the switching thin film transistor Q2 is turned off.

The OLED 70 includes an anode connected to the output terminal of the driving thin film transistor Q1, and a cathode connected to a common voltage Vss. The OLED 70 displays an image by emitting light of varying intensities according to the output current ILD of the driving thin film transistor Q1.

Figure 2:
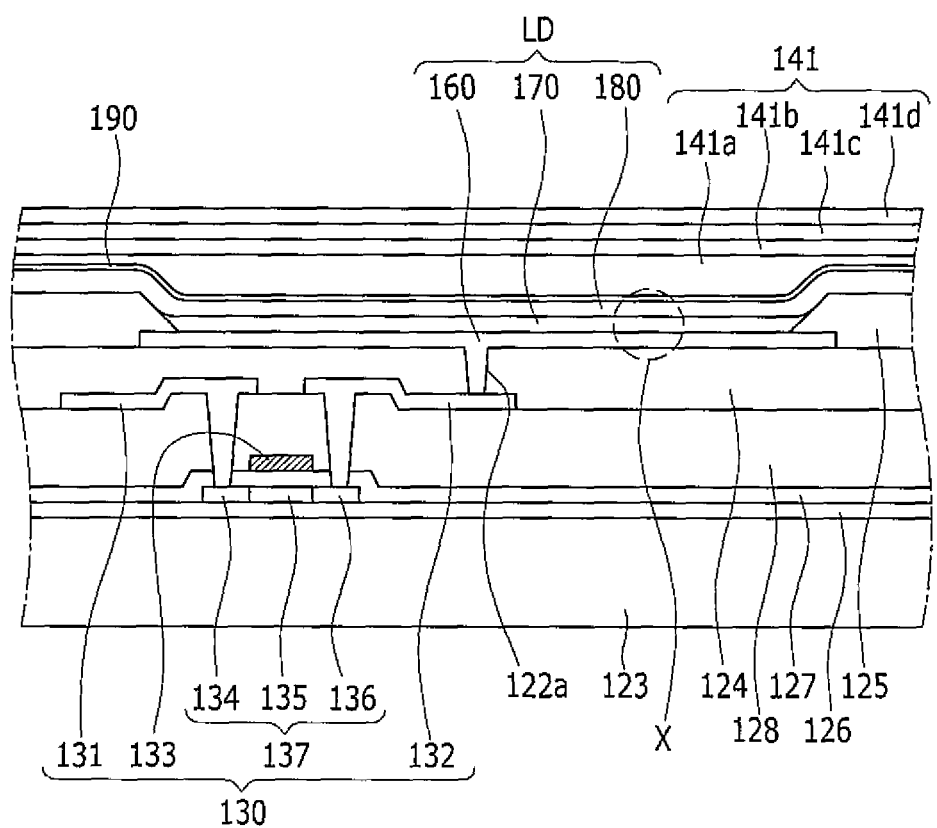
FIG. 2 is a cross-sectional view of the OLED display according to the present embodiment.
Figure 3:
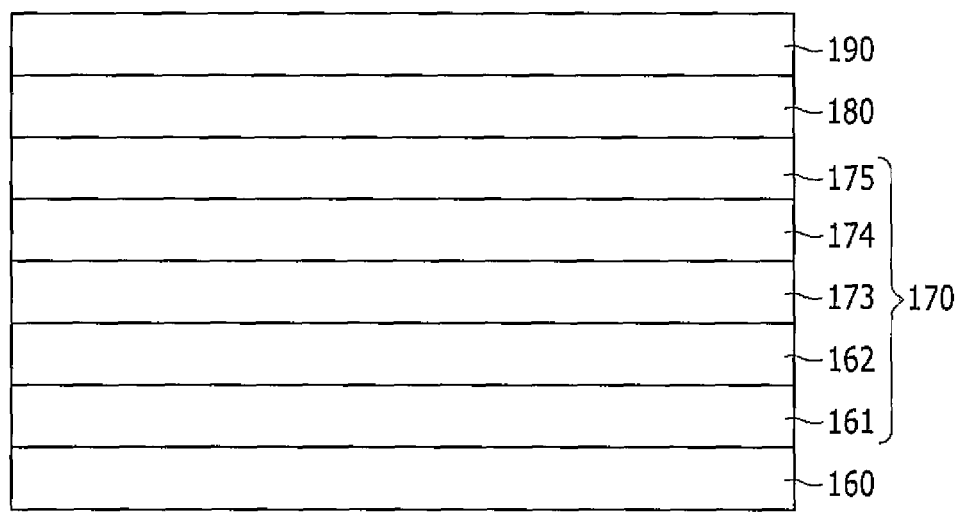
FIG. 3 is an enlarged cross-sectional view of the light-emitting element according to the present embodiment.

With reference to FIGS. 2 and 3, the OLED display according to the present embodiment will now be described in detail. FIG. 2 is a cross-sectional view of the OLED display according to the present embodiment, and FIG. 3 is an enlarged cross-sectional view of the light-emitting element according to the present embodiment.

Referring to FIGS. 2 and 3, the OLED display according to the current exemplary embodiment of the present disclosure includes a substrate 123, a thin film transistor 130, a first electrode 160, first layers 161 and 162, an emission layer 173, second layers 174 and 175, a second electrode 180, and a capping layer 190. The first layers 161 and 162 may include a hole injection layer 161 and a hole transporting layer 162, while the second layers 174 and 175 may include an electron transporting layer 174 and an electron injection layer 175.

In the present embodiment, the substrate 123 is an insulating substrate that is made of glass, quartz, ceramic, plastic, etc. However, the embodiments of the present disclosure are not limited thereto, and the substrate 123 may be a metallic substrate that is made of stainless steel or the like.

In addition, a substrate buffer layer 126 is on the substrate 123, and serves to prevent penetration of impurity elements and to planarize a surface of the substrate 123. In the present embodiment, the substrate buffer layer 126 may be formed of various materials that can perform the above-described function. For example, any one of a silicon nitride (SiNx) layer, a silicon oxide (SiOy) layer, and a silicon oxynitride (SiOyNx) layer may be used as the substrate buffer layer 126. However, the substrate buffer layer 126 may be omitted in other embodiments depending on the type of substrate 123 used and depending on processing conditions thereof.

A driving semiconductor layer 137 is on the substrate buffer layer 126. The driving semiconductor layer 137 may be formed of a polysilicon layer. In addition, the driving semiconductor layer 137 includes a channel region 135 where no impurity is doped, and source and drain regions 134 and 136 where impurities are doped at respective sides of the channel region 135. In the present embodiment, the doped impurities may vary according to the type of thin film transistor used.

A gate insulating layer 127 that is made of a silicon nitride (SiNx) or a silicon oxide (SiOy) is on the driving semiconductor layer 137. A gate wire including a driving gate electrode 133 is on the gate insulating layer 127. In addition, the driving gate electrode 133 at least partially overlaps the driving semiconductor layer 137, specifically, the channel region 135.

An interlayer insulating layer 128 covering the driving gate electrode 133 is on the gate insulating layer 127. Contact holes respectively exposing the source and drain regions 134 and 136 of the driving semiconductor layer 137 are formed in the gate insulating layer 127 and in the interlayer insulating layer 128. The interlayer insulating layer 128 may be made of a ceramic-based material such as a silicon nitride (SiNx) or a silicon oxide (SiOy), as is the gate insulating layer 127.

In addition, a data wire including a driving source electrode 131 and a driving drain electrode 132 is on the interlayer insulating layer 128. The driving source electrode 131 and the driving drain electrode 132 are respectively connected to the source and drain regions 134 and 136 of the driving semiconductor layer 137 via the contact holes formed in the interlayer insulating layer 128 and in the gate insulating layer 127.

As such, the driving thin film transistor 130 is formed by including the driving semiconductor layer 137, the driving gate electrode 133, the driving source electrode 131, and the driving drain electrode 132. The configuration of the driving thin film transistor 130 is not limited to the example described above, and can be variously modified in accordance with the disclosed configurations that can be easily practiced by those skilled in the art.

In addition, a planarization layer 124 covering the data wire (131/132) is on the interlayer insulating layer 128. The planarization layer 124 serves to eliminate a step, and thus planarize a surface so as to improve luminous efficiency of the organic light-emitting element, which will be formed on the planarization layer 124. In addition, the planarization layer 124 has an electrode contact hole 122a that exposes some of the drain electrode 132. The planarization layer 124 may be made of one or more of a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB). It should be noted that the embodiments of the present disclosure are not limited to the structure described above, and either or both of the planarization layer 124 and the interlayer insulating layer 128 may be omitted in other embodiments.

In the present embodiment, the anode 160 is the first electrode 160 of the OLED on the planarization layer 124. The OLED display includes a plurality of first electrodes 160 that respectively correspond to each of the plurality of pixels, and that are separated/electrically insulated from each other. The first electrode 160 is connected to the drain electrode 132 via the electrode contact hole 122a of the planarization layer 124.

Though not illustrated, the first electrode 160 may include first and second transparent electrodes including a transparent conductive material, and may include a transflective layer between the first and second transparent electrodes to form a microcavity structure along with the second electrode 180. That is, the first electrode 160 may have a structure in which the first transparent electrode, the transflective layer, and the second transparent electrode are sequentially laminated, wherein the first and second transparent electrodes may include at least any one selected from a group of an indium tin oxide (ITO), an indium zinc oxide (IZO), a zinc oxide (ZnO), an indium oxide (In2O3), an indium gallium oxide (IGO), and an aluminum zinc oxide (AZO), and wherein the transflective layer may be at least one selected from a group of Ag, Mg, Al, Pt, Pd, Au, Ni, Nd, Ir, Cr, Li, Ca, and Yb that is formed as a thin film of several nanometers or tens of nanometers.

In addition, a pixel defining layer 125 including an opening for exposing the first electrode 160 is on the planarization layer 124. That is, the pixel defining layer 125 includes a plurality of openings that are respectively formed for each of the pixels. In this case, an organic emission layer 170 may be provided in each opening that is formed by the pixel defining layer 125. Accordingly, a pixel area where each organic emission layer 170 is formed may be defined by the pixel defining layer 125.

In the present embodiment, the first electrode 160 corresponds to the opening of the pixel defining layer 125. However, the first electrode 160 is not necessarily located only in the opening of the pixel defining layer 125, but may also be partially located below the pixel defining layer 125, such that the pixel defining layer 125 partially overlaps the first electrode 160. The pixel defining layer 125 may be made of a polyacrylate resin, a polyimide resin, or a silica-based inorganic material.

Meanwhile, the organic emission layer 170 is on the first electrode 160. A structure of the organic emission layer 170 will be described in detail below.

In addition, the second electrode 180, i.e., the cathode 180 in the present embodiment, may be located on the organic emission layer 170. As such, an organic light emitting element LD including the first electrode 160, the organic emission layer 170, and the second electrode 180 is formed. In the present embodiment, the second electrode 180 may be made of any one of silver (Ag) and alloys thereof (Ag:Yb, Ag:Mg, Ag:Al, Ag:Al:Mg, etc.), and may be formed as a plurality of layers. The content of silver (Ag) may be 90 vol % or more. The second electrode 180 including silver (Ag) and alloys thereof may provide high reliability and stability to the device because such materials have superior reflectance and less light absorption. A thickness of the second electrode 180 may be about 65 Å to about 125 Å.

The OLED display according to the present embodiment is exemplarily described as a top emission type, in which the first electrode 160 includes a transflective layer, and in which the second electrode 180 does not include a transflective layer, although the present disclosure is not limited thereto, and the OLED display may be a bottom emission type or a dual emission type, depending on the materials used for forming the first electrode 160 and the second electrode 180.

The capping layer 190 for covering and protecting the second electrode 180 is on the second electrode 180, and may be formed of an organic layer or an inorganic layer. A thickness of the capping layer 190 may be about (500*1.88/n) Å to about (700*1.88/n) Å for an optical constant of n at a wavelength of about 530 nm (e.g., when a wavelength of light emitted by the organic emission layer 170 is about 530 nm). For example, as one exemplary embodiment of the present disclosure, a thickness of the capping layer 190 may be about 500 Å to about 700 Å for an optical constant of about 1.88 at a wavelength of about 530 nm. In addition, as another exemplary embodiment of the present disclosure, a thickness of the capping layer 190 may be about 454 Å to about 700 Å for an optical constant of about 2.07 at a wavelength of about 530 nm. In addition, as another exemplary embodiment of the present disclosure, a thickness of the capping layer 190 may be about 398 Å to about 557 Å for an optical constant of about 2.36 at a wavelength of about 530 nm.

In addition, a thin film encapsulation layer 141 is on the capping layer 190. The thin film encapsulation layer 141 seals and protects the organic light emitting element LD and a driving circuit unit/the driving thin film transistor 130 configuration on the substrate 123 from the outside (e.g., air and external impurities).

The thin film encapsulation layer 141 includes organic encapsulation layers 141a and 141c and inorganic encapsulation layers 141b and 141d that are alternately laminated one at a time. FIG. 2 shows a illustrative case in which two organic encapsulation layers 141a and 141c and two inorganic encapsulation layers 141b and 141d are alternately laminated one-by-one to configure the thin film encapsulation layer 141, although the present disclosure is not limited thereto.

With reference to FIG. 3, the organic light emitting element of the present disclosure will now be described in detail. FIG. 3 illustrates a partial enlarged cross-sectional view of the organic light emitting element of FIG. 2.

The organic light emitting element according to the current exemplary embodiment of the present disclosure (a region of which being indicated by X in FIG. 2) has a structure in which the first electrode 160, the hole injection layer 161, the hole transporting layer 162, the emission layer 173, the electron transporting layer 174, the electron injection layer 175, the second electrode 180, and the capping layer 190 are sequentially laminated. That is, the organic emission layer 170 of FIG. 2 includes the hole injection layer 161, the hole transporting layer 162, the emission layer 173, the electron transporting layer 174, and the electron injection layer 175 of FIG. 3.

In the present embodiment, the hole injection layer 161 may be on the first electrode 160, and may be a layer that serves to improve hole injection from the first electrode 160 to the hole transporting layer 162. The hole injection layer 161 may include cupper phthalocyanine (CuPc), poly(3,4-ethylenedioxythiophene) (PEDOT), polyaniline (PANI), N,N-dinaphthyl-N,N'-diphenyl benzidine (NPD), and the like, although the present disclosure is not limited thereto.

The hole transporting layer 162 may be on the hole injection layer 161, and may serve to efficiently transport holes transferred from the hole injection layer 161. For example, the hole transporting layer 162 includes NPD (N,N-dinaphthyl-N,N'-diphenyl benzidine), TPD (N, N'-bis-(3-methylphenyl)-N,N'-bis-(phenyl)-benzidine), s-TAD, MTDATA (4,4',4"-tris (N-3-methylphenyl-N-phenyl-amino)-triphenylamine), etc., although the present disclosure is not limited thereto.

In the current exemplary embodiment, the hole injection layer 161 and the hole transporting layer 162 form a laminated structure, although they are not limited thereto, and the hole injection layer 161 and the hole transporting layer 162 may instead be formed as a single layer.

Further, a buffer layer may be further included to be located on the hole transporting layer 1362, and may control an amount of holes transferred from the first electrode 160 to the emission layer 173, and may also control an amount of electrons penetrating from the emission layer 173 to the hole transporting layer 162. That is, the optional buffer layer may serve to control the amount of holes while blocking the electrons, may help combination of the holes and the electrons, and may block the electrons from penetrating the hole transporting layer 162, thereby preventing the hole transporting layer 162 from being damaged by the electrons.

The emission layer 173 includes a light-emitting material that exhibits a given color. For example, the emission layer 173 may exhibit primary colors, such as blue, green, and red, or may exhibit a combination of the primary colors. As an example of the present disclosure, the emission layer 173 may include a blue emission layer, a green emission layer, and a red emission layer. The emission layer 173 includes a host and a dopant, and may include a material that emits red, green, blue, and white light, and may be formed using a phosphorescent or fluorescent material.

When configured to emit red light, the emission layer 173 includes a host material that includes CBP (carbazole biphenyl) or mCP (1,3-bis(carbazol-9-yl), and may be made of a phosphorescent material including a dopant that includes one or more selected from a group of PIQIr(acac) (bis(1-phenylisoquinoline)acetylacetonate iridium), PQIr(acac) (bis(1-phenylquinoline)acetylacetonate iridium), PQIr (tris (1-phenylquinoline)iridium), and PtOEP (octaethylporphyrin platinum), or alternatively, may be made of a fluorescent material including PBD:Eu(DBM)3(Phen) or perylene, although the emission layer 173 is not limited thereto.

When configured to emit green light, the emission layer 173 includes a host material that includes CBP or mCP, and may be made of a phosphorescent material that includes a dopant material including Ir(ppy)3 (fac-tris(2-phenylpyridine)iridium), or alternatively, may be made of a fluorescent material including Alq3 (tris(8-hydroxyquinolino)aluminum), although the emission layer 173 is not limited thereto.

When configured to emit blue light, the emission layer 173 includes a host material including CBP or mCP, and may be made of a phosphorescent material that includes a dopant material including (4,6-F2ppy)2Irpic. Alternatively, the emission layer 173 may be made of a fluorescent material including at least one selected from a group of spiro-DPVBi, spiro-6P, distyryl benzene (DSB), distyrylarylene (DSA), a PFO-based polymer, and a PPV-based polymer, although the emission layer 173 is not limited thereto.

The electron transporting layer 174 may be disposed on the emission layer 173. In this case, the electron transporting layer 174 may transfer electrons from the second electrode 180 to the emission layer 173. In addition, the electron transporting layer 174 may prevent holes injected from the first electrode 160 from passing through the emission layer 173 and moving to the second electrode 180. That is, the electron transporting layer 174 may serve as a hole blocking layer, and may help combination of the holes and electrons in the emission layer 173. In the present embodiment, the electron transporting layer 174 may be made of one or more selected from a group of Alq3 (tris(8-hydroxyquinolino) aluminum), PBD, TAZ, spiro-PBD, BAlq, and SAlq, although the present disclosure is not limited thereto.

The electron injection layer 175 is on the electron transporting layer 174, and is a layer that serves to improve electron injection from the second electrode 180 to the electron transporting layer 174. The electron injection layer 175 may include Alq3, LiF, a gallium (Ga) complex, PBD, etc., although the electron injection layer 175 is not limited thereto.

Figure 4:
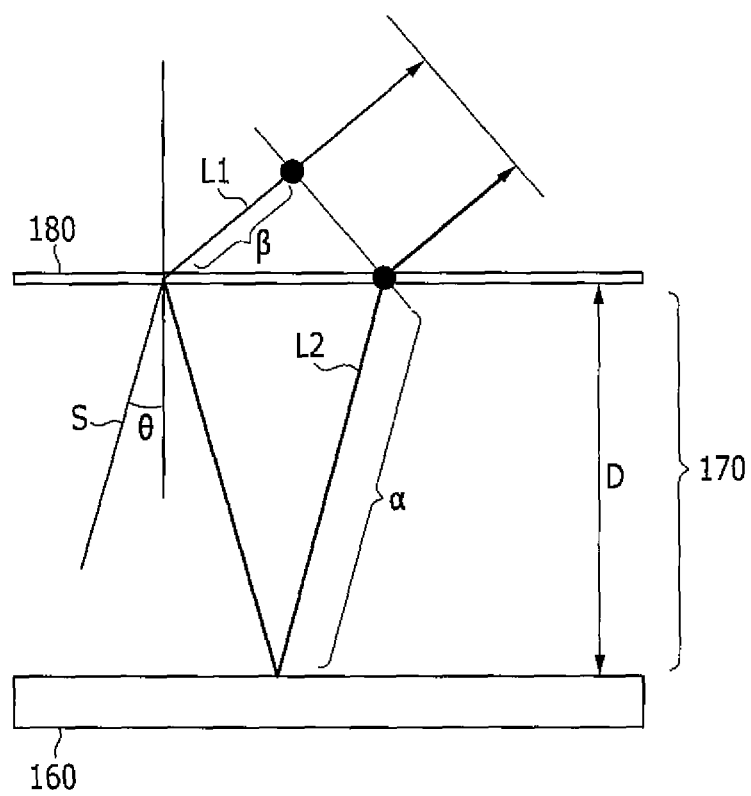
FIGS. 4 and 5 are schematic cross-sectional views showing a light-emitting mechanism in an organic emission layer.
Figure 5:
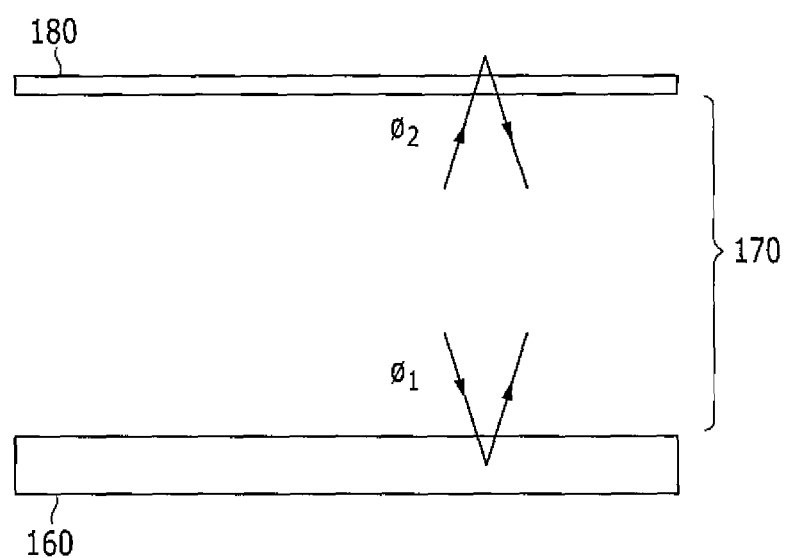

With reference to FIGS. 4 and 5, a light-emitting mechanism in the organic emission layer 170 will be described. FIGS. 4 and 5 are schematic cross-sectional views illustrating the light-emitting mechanism in the organic emission layer 170. In FIGS. 4 and 5, the first electrode 160, the organic emission layer 170, and the second electrode 180 are illustrated.

The first electrode 160 serves as a reflective electrode that reflects light, while the second electrode 180 serves as a semitransparent electrode that transmits some light while reflecting the rest of the light. Accordingly, some of the light radiated from the organic emission layer 170 passes through the second electrode 180 to be emitted to exterior of the display, while the rest of the light radiated from the organic emission layer 170 does not pass through the second electrode 180, and is reflected back to the first electrode 160. In other words, light may be repeatedly reflected between the first and second electrodes 160 and 180 due to generation of optical resonance. Such a phenomenon is called a microcavity phenomenon.

In addition, the light radiated from the organic emission layer 170 may have a varying wavelength depending on an emission angle. Specifically, when more of a vertical component is present in the light when compared to a horizontal component of the light, that is when the emission angle ($\theta$) of the light increases, the wavelength of the light becomes shorter and moves to a blue wavelength band. From a user's point of view, as a viewing angle increases, a blue shift phenomenon of the image becomes more recognizable by the user.

A resonance distance associated with a wavelength of a first incident light L1 of the light S radiated from the organic emission layer 170, which is directly transmitted through the second electrode 180 to be emitted to the outside, may be different from a resonance distance associated with a wavelength of a second incident light L2 of the light S radiated from the organic emission layer 170, which is not directly transmitted through the second electrode 180, but is instead reflected back to the first electrode 160, is reflected off of the first electrode 160, and is then transmitted through the second electrode 180 to be emitted outside of the display panel. That is, the blue shift phenomenon may be generated in proportion to a path difference ($\alpha$-$\beta$) between the second incident light L2 and the first incident light L1.

The phase shift according to the path difference ($\alpha$-$\beta$) between the second incident light L2 and the first incident light L1 may be represented by $2*n*D*\cos(\theta)$, where n is an optical constant of the organic emission layer 170, D is a distance between the first electrode 160 and the second electrode 180, and $\theta$ is an emission angle that is tilted relative to a vertical component of light. The phase shift according to the path difference (α−β) between the second incident light L2 and the first incident light L1 may be represented by $2\pi(2*n*D*\cos(\theta))/\lambda$ when calculated to an angle. Here, λ is a wavelength of light.

In addition, referring to FIG. 5, the blue shift phenomenon may vary depending on a first reflection phase ø1 of the light S radiated from the organic emission layer 170, which is reflected by the first electrode 160, and depending on a second reflection phase ø2 of the light S radiated from the organic emission layer 170, which is reflected by the second electrode 180. That is, blue shift may be determined by the phase shift according to the path difference (α−β) between the second incident light L2 and the first incident light L1, the first reflection phase ø1 reflected by the first electrode 160, and the second reflection phase ø2 reflected by the second electrode 180, and may be represented by $2\pi(2*n*D*\cos(\theta))/\lambda+(\text{ø}1+\text{ø}2)$.

Figure 6:
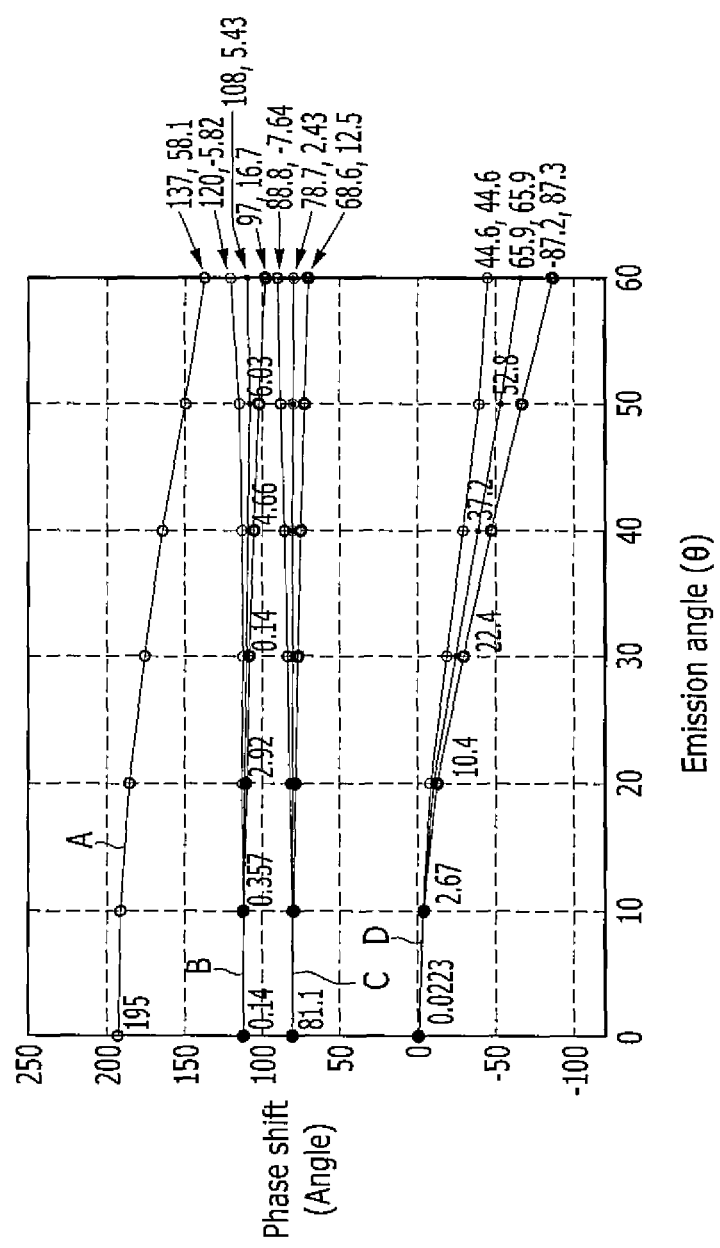
FIG. 6 is a graph showing a blue shift phenomenon when a thickness of a second electrode is about 100 Å and a thickness of a capping layer is about 830 Å.
Figure 7:
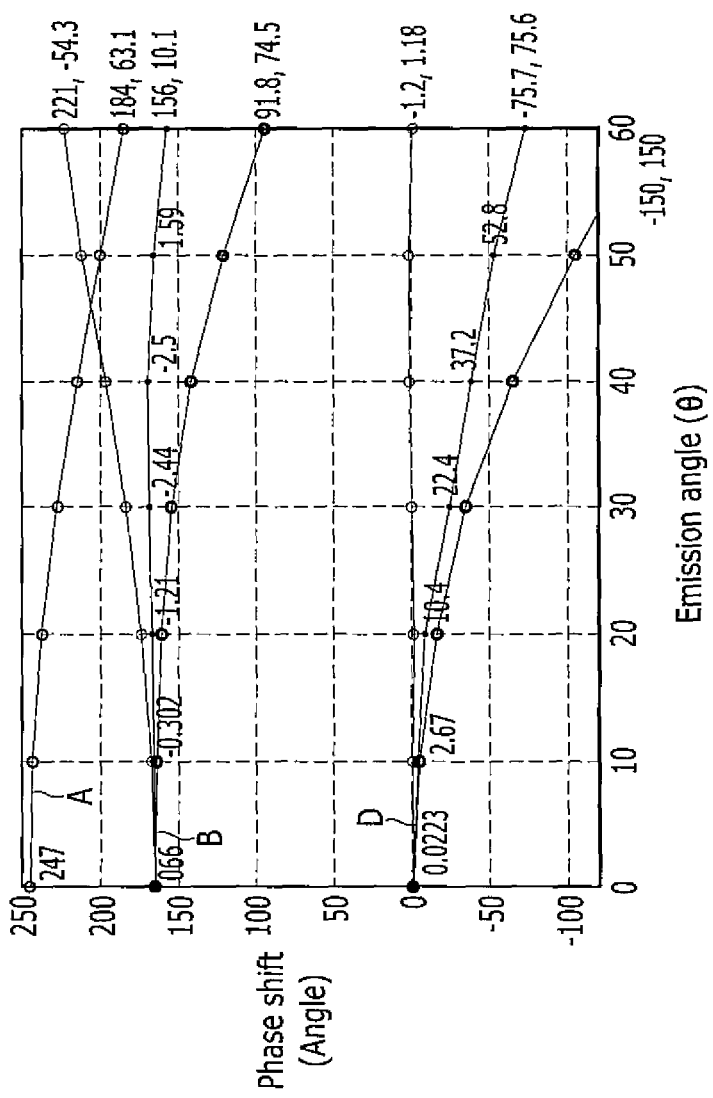
FIG. 7 is a graph showing a blue shift phenomenon when a thickness of the second electrode is about 100 Å and a thickness of the capping layer is about 350 Å.
Figure 8:
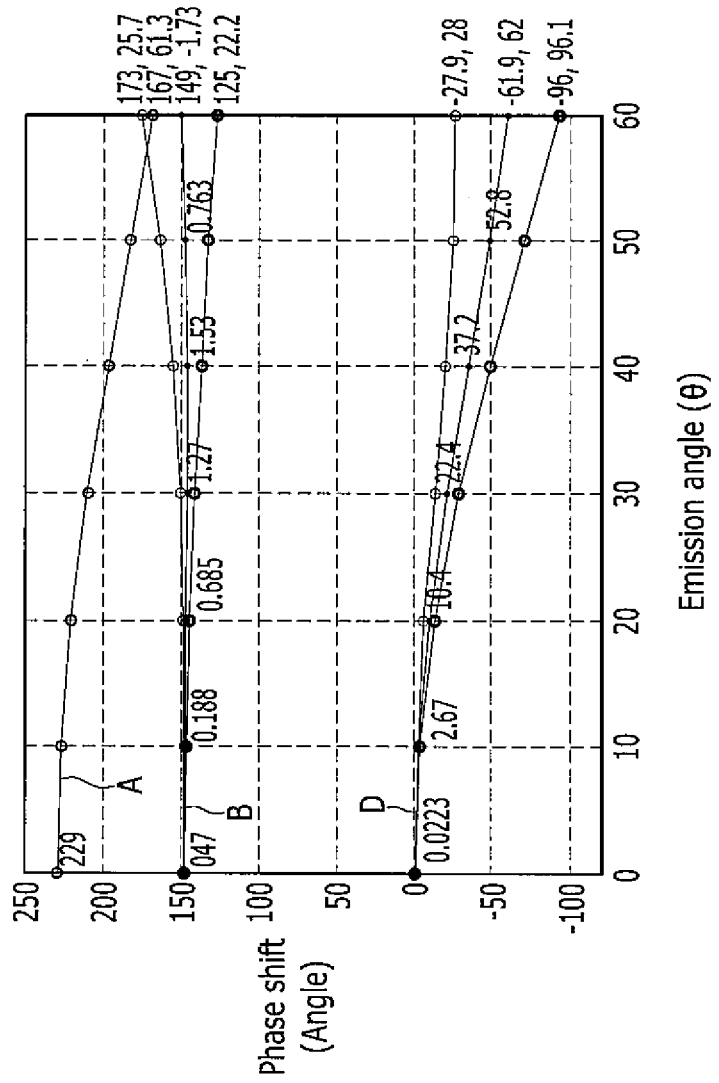
FIG. 8 is a graph showing a blue shift phenomenon when a thickness of the second electrode is about 100 Å and a thickness of the capping layer is about 550 Å.
Figure 9:
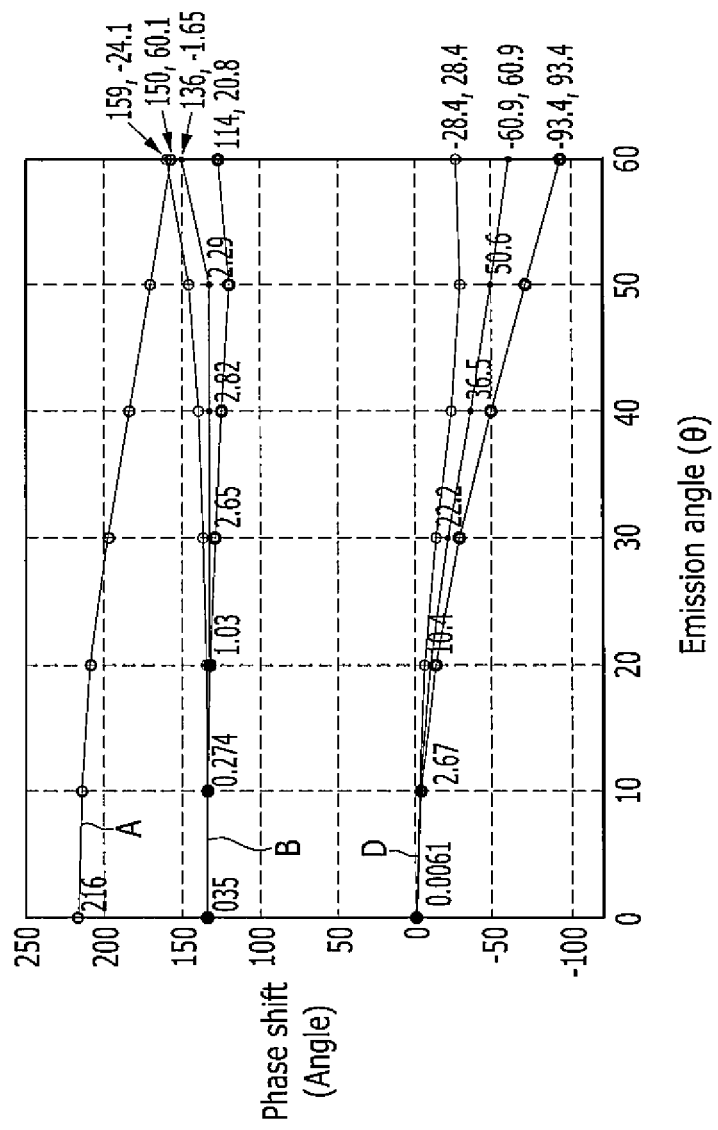
FIG. 9 is a graph showing a blue shift phenomenon when a thickness of the second electrode is about 100 Å and a thickness of the capping layer is about 650 Å.

Hereinafter, referring to FIGS. 6 to 9, a tendency of how the blue shift phenomenon varies according to thicknesses of the second electrode and the capping layer will be described. FIG. 6 is a graph showing a blue shift phenomenon when a thickness of the second electrode is about 100 Å and a thickness of the capping layer is about 830 Å, FIG. 7 is a graph showing a blue shift phenomenon when a thickness of the second electrode is about 100 Å and a thickness of the capping layer is about 350 Å, FIG. 8 is a graph showing a blue shift phenomenon when a thickness of the second electrode is about 100 Å and a thickness of the capping layer is about 550 Å, and FIG. 9 is a graph showing a blue shift phenomenon when a thickness of the second electrode is about 100 Å and a thickness of the capping layer is about 650 Å. Each horizontal axis of FIGS. 6 to 9 represents an emission angle (θ), and each vertical axis of FIGS. 6 to 9 represents a phase shift. In this case, the capping layer has an optical constant of about 1.88 at a wavelength of about 530 nm.

First, referring to FIG. 6, the line A represents a phase shift according to the path difference (α−β) between the second incident light L2 and the first incident light L1. Because the phase shift according to the path difference (α−β) between the second incident light L2 and the first incident light L1 is proportional to cos(θ), the phase shift decreases as the emission angle (θ) approaches 90°.

The line B represents a phase shift according to the second reflection phase φ2 reflected by the second electrode 180, and the line C represents a phase shift according to the first reflection phase φ1 reflected by the first electrode 160.

Light reflected from the first electrode 160 and the second electrode 180 is divided, according to its polarization, into a P-wave component, which is light of a vertical polarization component, and an S-wave component, which is light of a horizontal polarization component. Phase shifts generated in the first electrode 160 and the second electrode 180 are determined by an average of the P-wave component and the S-wave component.

For example, based on the emission angle (θ) of 60°, a P-wave component of the light reflected from the second electrode 180 is about −5.82, which reduces blue shift, an S-wave component is about 16.7, which causes/increases blue shift, and a phase shift according to the second reflection phase ø2 is about 5.43, which is an average of the P-wave component and the S-wave component, and thus causes blue shift.

In addition, based on the emission angle (θ) of 60°, a P-wave component of the light reflected from the first electrode 160 is about −7.64, which reduces blue shift, an S-wave component is about 12.5, which causes/increases blue shift, and a phase shift according to the first reflection phase ø1 is about 2.43, which is an average of the P-wave component and the S-wave component, and thus causes blue shift.

The line ID represents an overall phase shift that is determined by $2\pi(2*n*D*\cos(\theta))/\lambda+(\text{ø}1+\text{ø}2)$.

Considering the P-wave component, based on the emission angle (θ) of 60°, $2\pi(2*n*D*\cos(\theta))/\lambda$, which is the phase shift according to the path difference (α−β) between the second incident light L2 and the first incident light L1, is about 58.1, the first reflection phase ø1 is about −7.64, and the second reflection phase ø2 is about −5.82. That is, the overall phase shift according to the P-wave component is about 58.1−(7.64+5.82)=44.6.

Considering the S-wave component, based on the emission angle (θ) of 60°, $2\pi(2*n*D*\cos(\theta))/\lambda$, which is the phase shift according to the path difference (α−β) between the second incident light L2 and the first incident light L1, is about 58.1, the first reflection phase ø1 is about 12.5, and the second reflection phase ø2 is about 16.7. That is, the overall phase shift according to the S-wave component is about 58.1+(12.5+16.7)=87.3

Accordingly, the overall phase shift in which both of the P-wave component and the S-wave component are considered is about (44.6+87.3)/2=65.9, thereby inducing the blue shift.

Now, referring to FIGS. 7 to 9, when a thickness of the second electrode is about 100 Å, overall phase shifts can be seen according to a thickness variation of the capping layer.

First, referring to FIG. 7, when a thickness of the second electrode is about 100 Å, and when a thickness of the capping layer is about 350 Å, based on the emission angle (θ) of 60°, a phase shift according to the second reflection phase ø2 considering both of a P-wave component and an S-wave component is about 10.1, thereby causing the blue shift.

In this case, the phase shift considering both of the P-wave component and the S-wave component is about (1.18+150)/2=75.6, thereby causing the blue shift.

Next, referring to FIG. 8, when a thickness of the second electrode is about 100 Å, and when a thickness of the capping layer is about 550 Å, based on the emission angle (θ) of 60°, a phase shift according to the second reflection phase ø2 considering both of the P-wave component and the S-wave component is about −1.73, thereby reducing the blue shift.

In this case, the overall phase shift considering both of the P-wave component and the S-wave component is about (28+96.1)/2=62, thereby causing the blue shift.

Next, referring to FIG. 9, when a thickness of the second electrode is about 100 Å, and when a thickness of the capping layer is about 650 Å, based on the emission angle (θ) of 60°, a phase shift according to the second reflection phase ø2 considering both of the P-wave component and the S-wave component is about −1.65, thereby reducing the blue shift.

In this case, the overall phase shift considering both of the P-wave component and the S-wave component is about (28.4+93.4)/2=60.9, thereby causing the blue shift.

That is, when FIGS. 7 to 9 are compared, the second reflection phase ø2 is the smallest when the thickness of the second electrode is about 100 Å, and when the thickness of the capping layer is about 550 Å, thereby reducing the blue shift. The overall phase shift is the smallest when thickness of the second electrode is about 100 Å, and when a thickness of the capping layer is about 650 Å thereby reducing the blue shift.

As such, in the present embodiment, by forming the second electrode to have a thickness of about 65 Å to about 125 Å, and by forming the capping layer to have an optical constant of about 1.88 at a wavelength of about 530 nm to have a thickness of about 500 Å to about 700 Å, the blue shift can be reduced, and thus a side viewing, angle can be improved.

In addition, in another exemplary embodiment of the present disclosure, by forming a second electrode to have a thickness of about 65 Å to about 125 Å, and by forming a capping layer having an optical constant of about 2.07 at a wavelength of about 530 nm to have a thickness of about 454 Å to about 700 Å, blue shift can be reduced, and thus a side viewing angle can be improved.

In addition, in a further exemplary embodiment of the present disclosure, by forming a second electrode to have a thickness of about 65 Å to about 125 Å, and by forming a capping layer having an optical constant of about 2.36 at a wavelength of about 530 nm to have a thickness of about 398 Å to about 557 Å, blue shift can be reduced, and thus a side viewing angle can be improved.

In summary, in the present embodiment, by forming the second electrode to have the thickness of about 65 Å to about 125 Å, and the capping layer having an optical constant of n at a wavelength of about 530 nm to have thickness of about (500*1.88/n) Å to about (700*1.88/n) Å, the blue shift can be reduced, and thus the side viewing angle can be improved.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims and their equivalents.

| Description of Some of the Reference Characters | |
|---|---|
| 123: substrate | 130: thin film transistor |
| 160: first electrode | 171: hole injection layer |
| 172: hole transporting layer | 173: emission layer |
| 174: electron transporting layer | 175: electron injection layer |
| 180: second electrode | 190: capping layer |

What is claimed is:

1. An organic light emitting diode (OLED) display comprising:
   a substrate;
   a thin film transistor on the substrate;
   a first electrode on the thin film transistor and electrically coupled to the thin film transistor;
   an organic emission layer on the first electrode;
   a second electrode on the organic emission layer; and
   a capping layer on the second electrode,
   wherein a thickness of the second electrode is about 65 Å to about 125 Å, and
   wherein a thickness of the capping layer is about (500*1.88/n) Å to about (700*1.88/n) Å, n being an optical constant of the capping layer.

2. The OLED display of claim 1, wherein n corresponds to a wavelength of about 530 nm.

3. The OLED display of claim 2, wherein n is about 1.88 at a wavelength of about 530 nm.

4. The OLED display of claim 3, wherein the thickness of the capping layer is about 500 Å to about 700 Å.

5. The OLED display of claim 4, wherein the thickness of the capping layer is about 550 Å to about 650 Å.

6. The OLED display of claim 2, wherein n is about 2.07 at a wavelength of about 530 nm.

7. The OLED display of claim 6, wherein the thickness of the capping layer is about 454 Å to about 700 Å.

8. The OLED display of claim 2, wherein n is about 2.36 at a wavelength of about 530 nm.

9. The OLED display of claim 8, wherein the thickness of the capping layer is about 398 Å to about 557 Å.

10. The OLED display of claim 1, wherein the second electrode comprises silver (Ag).

11. The OLED display of claim 10, wherein the second electrode further comprises at least one of Yb, Mg, or Al.

12. The OLED display of claim 11, wherein the second electrode comprises about 90 vol % or more of the silver (Ag).

13. The OLED display of claim 1, wherein the thickness of the second electrode is about 95 Å to about 105 Å.

14. The OLED display of claim 1, wherein one of the first electrode and the second electrode comprises a transflective layer.

15. The OLED display of claim 1, wherein the capping layer comprises an organic layer or an inorganic layer.

16. The OLED display of claim 1, wherein the organic emission layer comprises:
   a hole injection layer and a hole transporting layer on the first electrode;
   an emission layer on the hole transporting layer; and
   an electron transporting layer and an electron injection layer on the emission layer.

17. The OLED display of claim 16, wherein the first electrode comprises an anode, and wherein the second electrode comprises a cathode.

18. The OLED display of claim 1, further comprising a thin film encapsulation layer that is on the capping layer, that is bonded and encapsulated with the substrate, and that encapsulates an organic light emitting element.

19. The OLED display of claim 1, wherein the second electrode further comprises Yb, and
   wherein the capping layer comprises an inorganic layer.

* * * * *